United States Patent
Lin et al.

(10) Patent No.: US 10,323,332 B2
(45) Date of Patent: *Jun. 18, 2019

(54) ELECTRICAL CHEMICAL PLATING PROCESS

(71) Applicant: UNITED MICROELECTRONICS CORP., Hsin-Chu (TW)

(72) Inventors: Chun-Ling Lin, Tainan (TW); Yen-Liang Lu, Kaohsiung (TW); Chi-Mao Hsu, Tainan (TW); Chin-Fu Lin, Tainan (TW); Chun-Hung Chen, Tainan (TW); Tsun-Min Cheng, Changhua County (TW); Chi-Ray Tsai, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 89 days.

This patent is subject to a terminal disclaimer.

(21) Appl. No.: 15/206,321

(22) Filed: Jul. 11, 2016

(65) Prior Publication Data

US 2016/0319450 A1  Nov. 3, 2016

Related U.S. Application Data

(63) Continuation of application No. 13/154,420, filed on Jun. 6, 2011, now Pat. No. 9,416,459.

(51) Int. Cl.
| | |
|---|---|
| C25D 7/12 | (2006.01) |
| C25D 5/00 | (2006.01) |
| C25D 3/38 | (2006.01) |
| C25D 5/10 | (2006.01) |
| C25D 5/54 | (2006.01) |
| H01L 21/288 | (2006.01) |
| H01L 21/768 | (2006.01) |

(52) U.S. Cl.
CPC ............... *C25D 7/123* (2013.01); *C25D 3/38* (2013.01); *C25D 5/00* (2013.01); *C25D 5/10* (2013.01); *C25D 5/54* (2013.01); *H01L 21/2885* (2013.01); *H01L 21/76879* (2013.01)

(58) Field of Classification Search
CPC ...................................................... C25D 7/123
See application file for complete search history.

(56) References Cited

U.S. PATENT DOCUMENTS

| | | | |
|---|---|---|---|
| 6,913,680 B1 * | 7/2005 | Zheng | C25D 5/18 205/102 |
| 7,585,768 B2 | 9/2009 | Bu | |

(Continued)

FOREIGN PATENT DOCUMENTS

| | | |
|---|---|---|
| CN | 101956221 A | 1/2011 |
| EP | 1103639 | 5/2001 |
| TW | 564265 | 12/2003 |

*Primary Examiner* — Bryan D. Ripa
(74) *Attorney, Agent, or Firm* — Winston Hsu

(57) ABSTRACT

An electrical chemical plating process is provided. A semiconductor structure is provided in an electrical plating platform. A pre-electrical-plating step is performed wherein the pre-electrical-plating step is carried out under a fixed voltage environment and lasts for 0.2 to 0.5 seconds after the current is above the threshold current of the electrical plating platform. After the pre-electrical-plating step, a first electrical plating step is performed on the semiconductor structure.

8 Claims, 5 Drawing Sheets

(56) References Cited

U.S. PATENT DOCUMENTS

| | | | |
|---|---|---|---|
| 2004/0149584 A1* | 8/2004 | Nagai | C25D 5/18 205/103 |
| 2004/0256240 A1* | 12/2004 | Nelsen | C25D 17/001 205/143 |
| 2005/0081744 A1* | 4/2005 | Klocke | C25D 3/38 106/1.18 |
| 2006/0049056 A1* | 3/2006 | Wang | C25D 3/02 205/123 |
| 2010/0224501 A1 | 9/2010 | Basol | |
| 2010/0300888 A1* | 12/2010 | Ponnuswamy | C25D 3/38 205/157 |

* cited by examiner

US 10,323,332 B2

ELECTRICAL CHEMICAL PLATING PROCESS

CROSS REFERENCE TO RELATED APPLICATIONS

This application is a Continuation application of application Ser. No. 13/154,420 filed Jun. 6, 2011, and included herein by reference.

BACKGROUND OF THE INVENTION

1. Field of the Invention

The present invention relates to an electrical chemical plating process, and more particularly, to an electrical chemical plating process having a pre-electrical-plating step so as to enhance the bottom filling ability of the metal layer.

2. Description of the Prior Art

As transistor devices continue to shrink in modern technology so do the feature sizes of the metal interconnection systems, and conventional metal material used as the metal interconnection systems is no longer suitable in current semiconductor industry because of its poor gap filling ability. Accordingly, metal copper which has high conductivity and good gap filling ability is widely used to manufacture metal interconnects having low critical dimension.

A chemical vapor deposition process is usually used to form a copper layer in conventional arts. The chemical vapor deposition process uses organic compounds as the source gas, so the resistively of formed copper layer is usually higher, especially when the thickness of the copper layer is increased. In addition, the residue after the CVP will result in poor adhesion between the copper layer and the above layer. Moreover, the cost of the CVP is usually high and is not suitable for semiconductor manufacturing processes.

Currently, a technology called electrical chemical plating (ECP) is widely used in the industry to form the copper layer, which can streamline the cost and form copper layers with low resistively. In the ECP process, a semiconductor substrate is immersed into an electrolytic solution containing copper ions. When a voltage is supplied, the copper ions will be reduced to form metal copper on the semiconductor substrate. However, conventional ECP processes usually confront a problem of poor bottom up filling rate, which may result in voids in the formed copper layer and therefore decrease the quality of the products. Accordingly, a lot of ECP processes are studied to provide a copper layer with good gap filling ability.

SUMMARY OF THE INVENTION

The present invention therefore provides an ECP process which can form a metal layer with good bottom up filling rate.

According to the claimed invention, an electrical chemical plating process is provided. A semiconductor structure is provided in an electrical plating machine. A pre-electrical-plating step is performed wherein the pre-electrical-plating step is carried out under a fixed voltage environment and lasts for 0.2 to 0.5 seconds after the current is above the threshold current of the electrical plating machine. After the pre-electrical-plating step, a first electrical plating step is performed on the semiconductor structure.

In the ECP process, a pre-electro-plating process under a fixed voltage environment is performed in the present invention. The pre-electro-plating process provided in the present invention is about 0.2 to 0.5 seconds, which is selected by considering both the electroplating time and the electroplating quality, so the yield of the product can be improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 illustrate schematic diagrams of the ECP process in the present invention, wherein FIG. 1 shows a semiconductor structure at the beginning of the ECP process in the present invention;

FIG. 2 shows a semiconductor structure after forming a trench in the present invention;

FIG. 3 shows a semiconductor structure after forming a seed layer in the present invention;

FIG. 4 shows a semiconductor structure after performing a pre-electrical-plating step in the present invention;

FIG. 5 shows a semiconductor structure after performing a first electro plating step in the present invention; and FIG. 6 shows a semiconductor structure after performing a second electro-plating process in the present invention.

DETAILED DESCRIPTION

To provide a better understanding of the presented invention, preferred embodiments will be made in detail. The preferred embodiments of the present invention are illustrated in the accompanying drawings with numbered elements.

Figure 1:
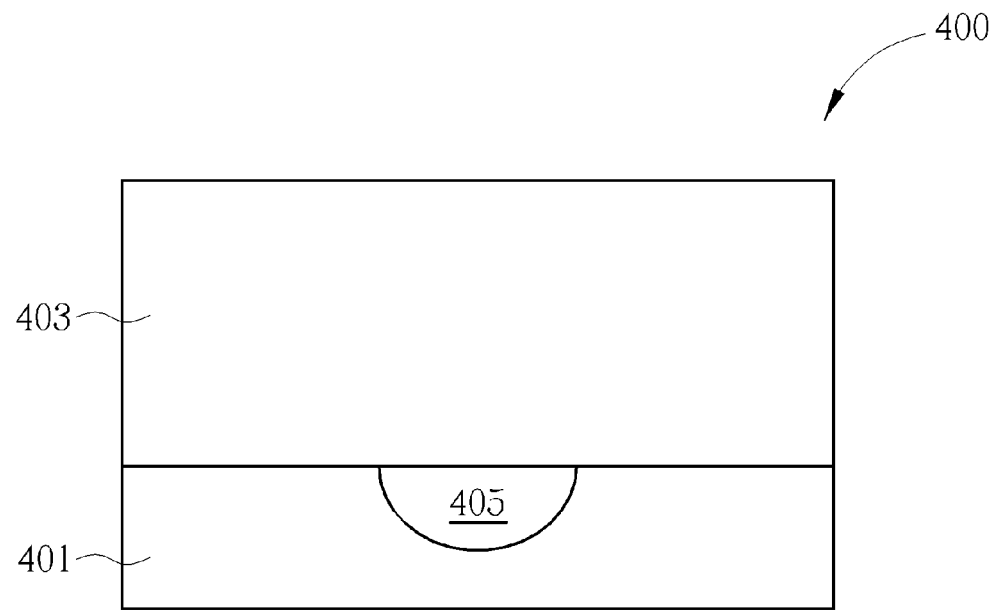

Please refer to FIG. 1 to FIG. 6, illustrating schematic diagrams of the ECP process in the present invention. As shown in FIG. 1, a semiconductor structure 400 is provided. In one embodiment, the semiconductor structure 400 includes a substrate 401 and a conductive region 405, such as a doping source/drain region or a metal interconnection pattern. In the subsequent process, the formed metal layer can be electrically connected to the conductive region 405. The insulation layer 403 can be $SiO_2$ or other low-k dielectric material.

Figure 2:
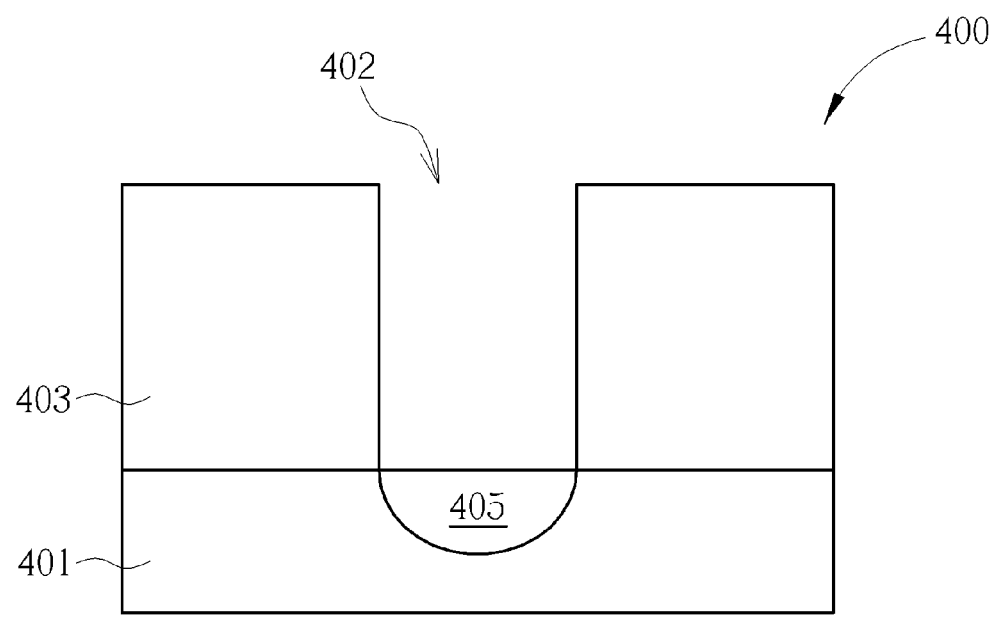

As shown in FIG. 2, a trench 402 is formed in the insulation layer 403 of the semiconductor structure. A photo-etching-process (PEP), for example, may be used to form the trench 402 and expose the conductive region 405. The pattern of the trench 402 can be any shape such as a circle or other irregular 3D dimension structures with an opening. In one embodiment, the depth of the trench 402 is substantially between 2000 A to 10000 A.

Figure 3:
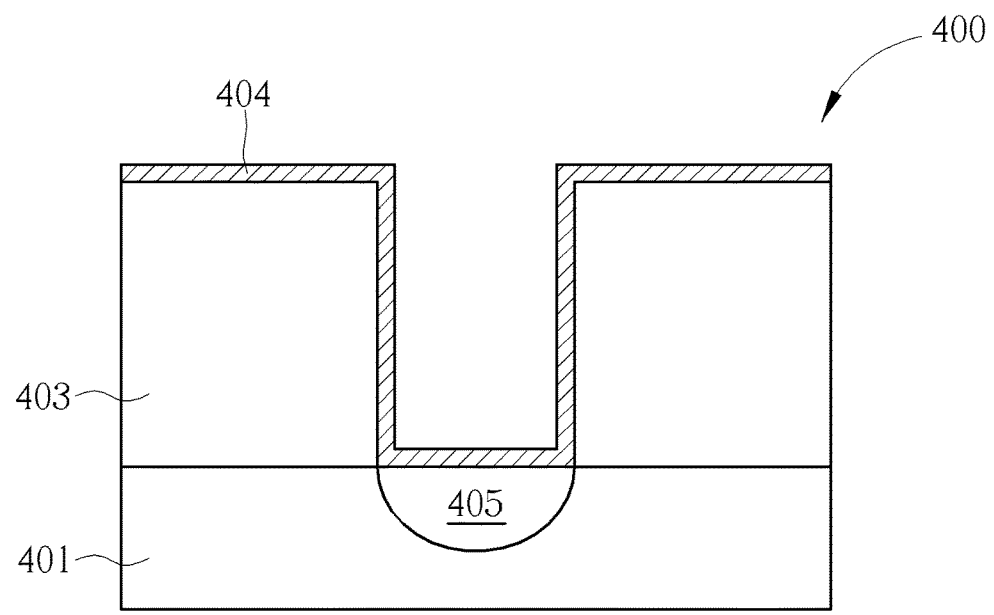

As shown in FIG. 3, a seed layer 404 is formed on the semiconductor structure 400. The method of forming the seed layer 404 may include PVD or CVD such that the seed layer 404 is formed on the insulation layer 403 and conformally on the surface of the trench 402. The thickness of the seed layer 404 may be 30 A to 200 A, for example. The material of the seed layer 404 depends on the metal layer. For example, when the metal layer is copper, the seed layer 404 is a copper seed layer. In another embodiment, before forming the seed layer 404, a barrier layer (not shown) can be selectively formed conformally on the semiconductor structure 400. The barrier layer, for example, can be a Ti/TiN layer or a Ta/TaN layer.

Figure 4:
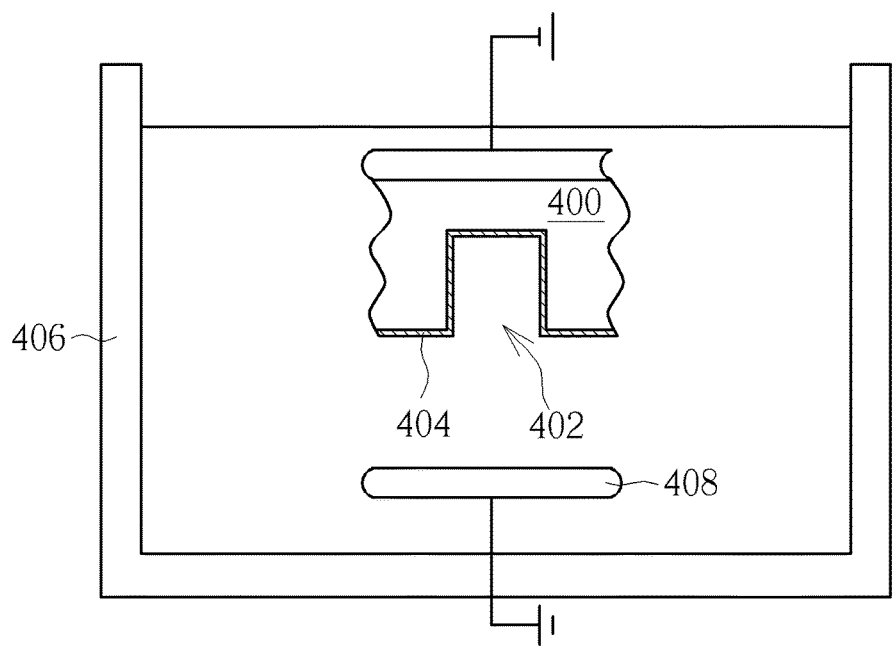

As shown in FIG. 4, a pre-electrical-plating step is performed. As described above, the trench 402 is now covered with the seed layer 404. When carrying out the pre-electrical-plating step, the semiconductor structure 400 is placed into an electrical plating machine 406 having an electrode 408. The pre-electro-plating process is a preparation process before the standard electroplating process. Since the standard process is not ready when the semiconductor structure is placed into the electro plating machine in the beginning, the pre-electro-plating process can be performed to enhance the quality of the standard electro plating process.

Figure 7:
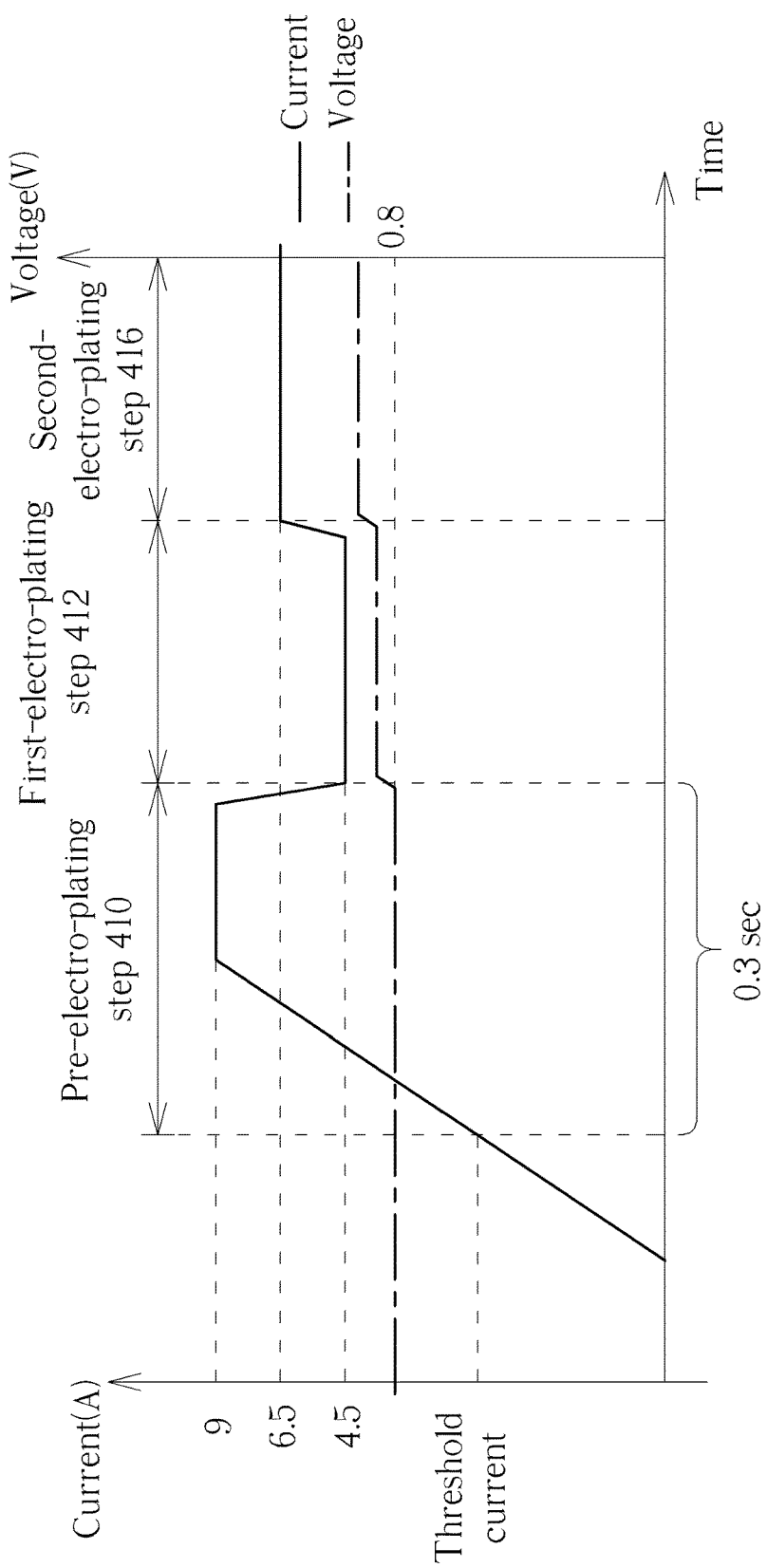
FIG. 7 illustrates a schematic diagram of the relationship of the voltage, the current and the time during the ECP process in the present invention.

Please refer to FIG. 7, illustrating a schematic diagram of the relationship of the voltage, the current and the time during the ECP process in the present invention. As shown in FIG. 7, when the electrode 408 is supplied with a predetermined voltage, the current in the electroplating machine 406 gradually increases. When the current reaches to the threshold current of the electro plating machine 406 (threshold current refers to a minimum current in which the electroplating machine can be operated), the pre-electro-plating process starts. The pre-electro-plating process in the present invention is operated under a fixed voltage environment. In one embodiment, the fixed voltage is about 0.6V to 1.0V, preferably 0.8V. The pre-electro-plating process lasts for 0.2 to 0.5 seconds, preferably 0.3 seconds. In one embodiment, during the pre-electro-plating process 410, the current increases and stops on a maximum value which is about 8 A to 10 A.

Figure 5:
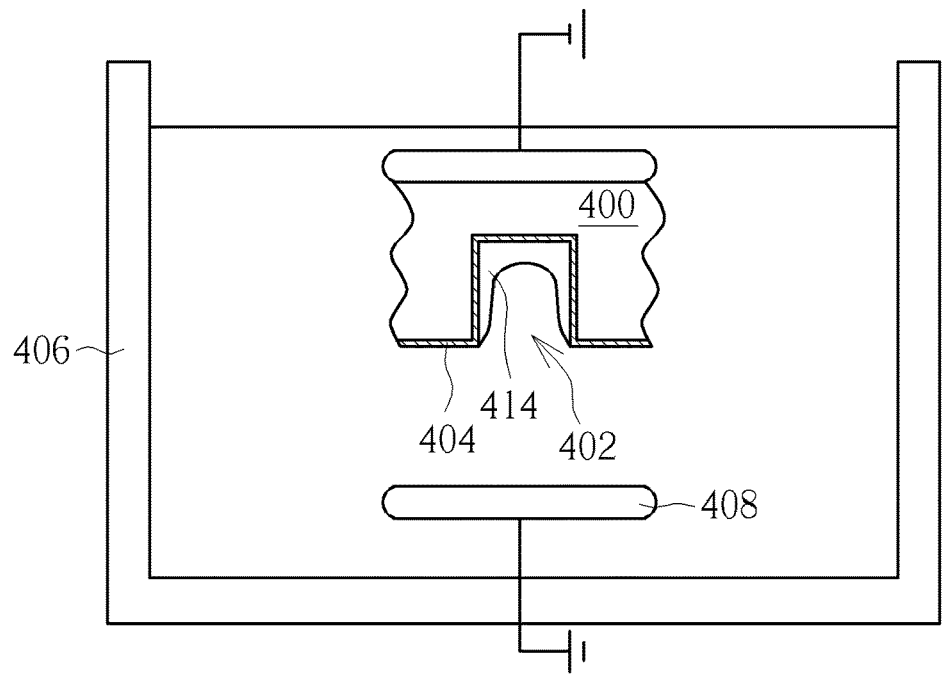

A first electro-plating process 412 is then carried out. As shown in FIG. 5, the first electro plating step 412 is the standard electro plating process where the metal layer 414 is gradually formed on the surface of the seed layer 404 in the trench 402. Since the pre-electro-plating process 410 is carried out before the first electro-plating process 412, the forming rate of the metal layer 414 on the bottom surface of the trench 402 is faster than that on the sidewall surface, so a better bottom up fill rate can be obtained. As shown in FIG. 7, in one preferred embodiment of the present invention, the first electro-plating-process is operated under a first fixed current environment which is about 4.0 A to 5.0 A, preferably 4.5 A.

Figure 6:
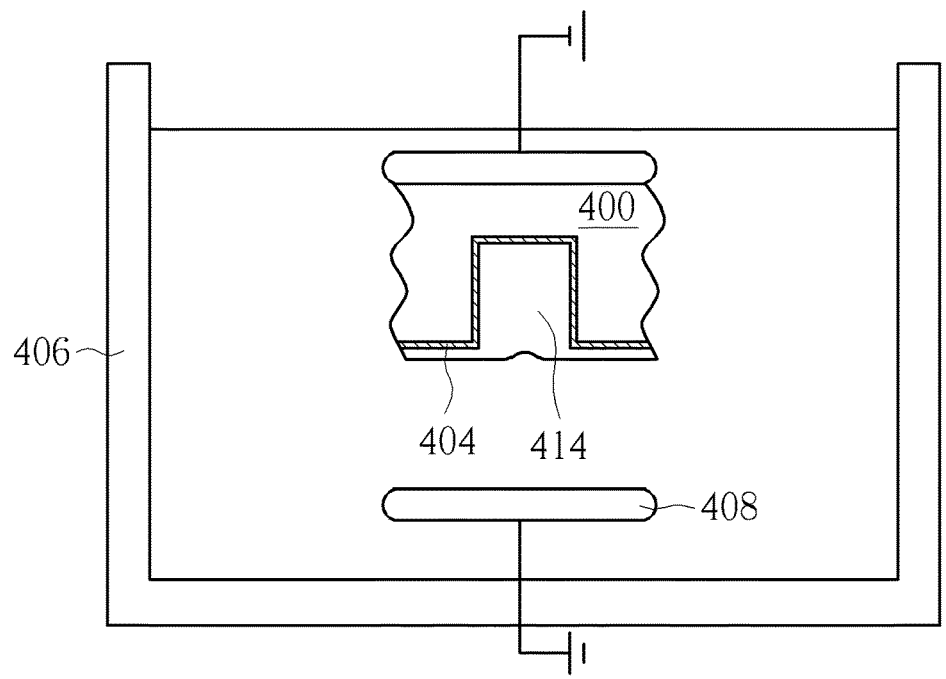

Next, as shown in FIG. 6, a second electro-plating process 416 is performed. During the second electro-plating process 416, the trench 402 is gradually filled with the metal layer 414. As shown in FIG. 7, in one preferred embodiment of the present invention, the second electro-plating-process is operated under a second fixed current environment. The second fixed current is preferably greater than the first fixed current. For example, the second fixed current is about 6.0 A to 7.0 A, preferably 6.5 A.

After the second electro-plating process 416, the metal layer 401 has been formed on the surface of the semiconductor structure 400 and has been filled into the trench 402. In another embodiment, depending on different thickness of the metal layer 414, a third electro-plating step can be optionally carried out after the second electro-plating step 416. Preferably, the third electro-plating-process is operated under a third fixed current environment where the third fixed current environment is preferably greater than the second fixed current environment. Lastly, after the ECP process, redundant metal layer 414 is removed away by a planarization process such as a chemical mechanical polish (CMP) process.

In the ECP process, a pre-electro-plating process under a fixed voltage environment is performed in the present invention. When considering the time of the pre-electro-plating process, if the time is too short (less than 0.2 sec for example), the following standard electro-plating process will require a lot of time; on the other hand, if the time is too long (more than 0.5 sec for example), it will lead to poor bottom filling capability of the metal layer. As a result, the pre-electro-plating process provided in the present invention is about 0.2 to 0.5 seconds, which is selected by considering both the electroplating time and the electroplating quality, so the yield of the product can be improved.

Figure 8:
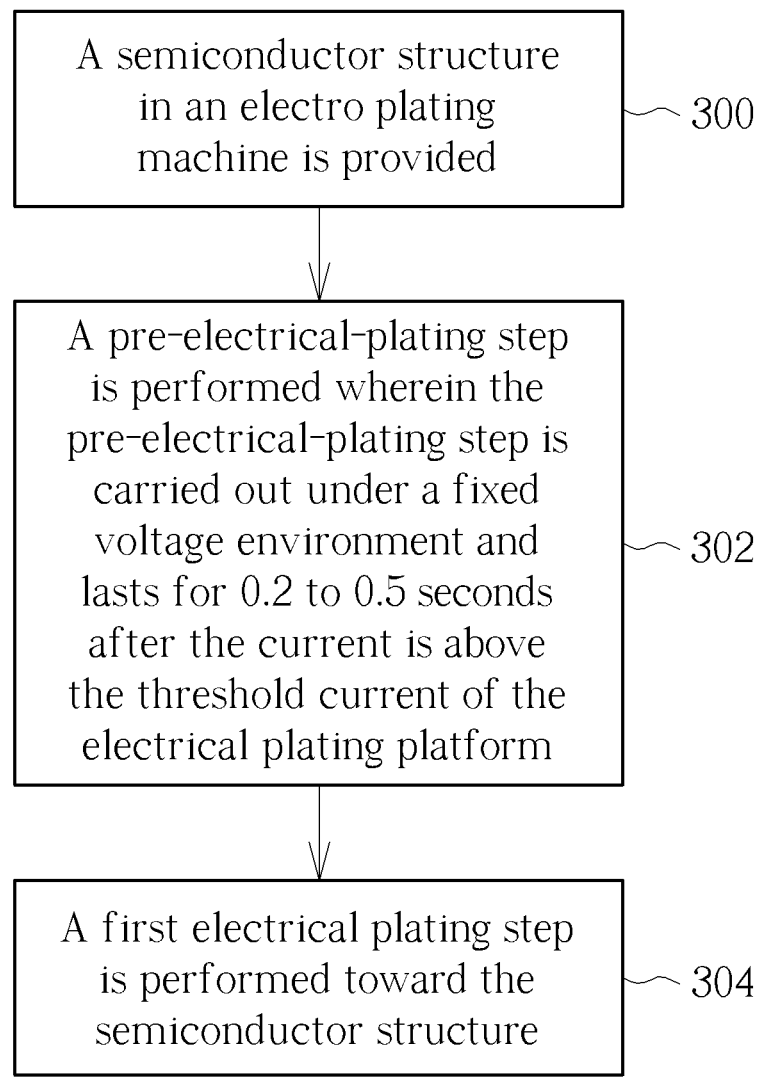
FIG. 8 illustrates a schematic diagram of a flow chart of the ECP process in the present invention.

Please refer to FIG. 8, illustrating a schematic diagram of a flow chart of the ECP process in the present invention. First, a semiconductor structure in an electro plating machine is provided (step 300). Next, a pre-electrical-plating step is performed wherein the pre-electrical-plating step is carried out under a fixed voltage environment and lasts for 0.2 to 0.5 seconds after the current is above the threshold current of the electrical plating platform (step 302). After the pre-electrical-plating step, a first electrical plating step is performed on the semiconductor structure (step 304).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrical chemical plating process, comprising:
providing a semiconductor structure in an electro-plating machine;
providing a pre-electro-plating step, wherein the pre-electro-plating step lasts for 0.2 to 0.5 seconds and a current in the pre-electro-plating step is gradually increased at a same rate to reach a maximum value and is maintained at the maximum value;
after the pre-electro-plating step, performing a first-electro-plating step, wherein the first-electro-plating step is performed under a first fixed current followed by a first current; and
after the first-electro-plating step, performing a second-electro-plating step, wherein the second-electro-plating step is performed under a second fixed current, the first current in the first-electro-plating step is gradually increased at a same rate to reach the second fixed current.

2. The electrical chemical plating process according to claim 1, wherein the pre-electro-plating step lasts for 0.3 seconds after the current exceeds a threshold current of the electro-plating machine.

3. The electrical chemical plating process according to claim 1, wherein the pre-electro-plating step is performed under a fixed voltage and the fixed voltage is 0.8V.

4. The electrical chemical plating process according to claim 1, wherein the maximum value of the current during the pre-electro-plating step is 10 A.

5. The electrical chemical plating process according to claim 1, wherein the first fixed current is between 4.0 A to 5.0 A.

6. The electrical chemical plating process according to claim 5, wherein the first fixed current is 4.5 A.

7. The electrical chemical plating process according to claim 1, wherein the second fixed current is greater than the first fixed current.

8. The electrical chemical plating process according to claim 1, wherein the second fixed current is between 6.0 A to 7.0 A.

\* \* \* \* \*